US006857089B2

(12) United States Patent
Schaber et al.

(10) Patent No.: US 6,857,089 B2
(45) Date of Patent: Feb. 15, 2005

(54) DIFFERENTIAL RECEIVER ARCHITECTURE

(75) Inventors: Scott D. Schaber, Roseville, MN (US); Scott C. Loftsgaarden, Shoreview, MN (US)

(73) Assignee: Teradyne, Inc., Boston, MA (US)

( * ) Notice: Subject to any disclaimer, the term of this patent is extended or adjusted under 35 U.S.C. 154(b) by 541 days.

(21) Appl. No.: 09/852,359

(22) Filed: May 9, 2001

(65) Prior Publication Data

US 2002/0170006 A1 Nov. 14, 2002

(51) Int. Cl.[7] .................. G01R 31/3177; G01R 31/319; G06F 11/25
(52) U.S. Cl. ...................................... 714/724; 714/736
(58) Field of Search ................................ 714/724, 736

(56) References Cited

U.S. PATENT DOCUMENTS

| | | | |
|---|---|---|---|
| 6,181,616 B1 | | 1/2001 | Byrd |
| 6,329,831 B1 | * | 12/2001 | Bui et al. .................... 324/765 |
| 6,430,725 B1 | * | 8/2002 | Reichle et al. ............... 714/815 |
| 6,486,693 B1 | * | 11/2002 | Conner et al. ............... 324/765 |
| 2003/0028832 A1 | * | 2/2003 | Schaber et al. ............. 714/700 |

FOREIGN PATENT DOCUMENTS

WO    WO0013186    3/2000

OTHER PUBLICATIONS

Dinh, Van D. et al: "An Approach to Testing 200 ps Echo Clock to Output Timing on the Double Data Rate Synchronous Memory"; Proceedings ITC, 2000; Baltimore MD, Oct. 30–Nov. 1, 2000, pp. 610–618.

* cited by examiner

*Primary Examiner*—R. Stephen Dildine
(74) *Attorney, Agent, or Firm*—Fogg and Associates, LLC; David N. Fogg

(57) ABSTRACT

A receiver circuit for a tester for electronic devices is provided. The receiver circuit includes a clock receiver that is adapted to receive a source synchronous clock signal from a device under test. The receiver circuit further includes a data receiver that is responsive to the clock circuit. The data receiver is adapted to receive at least one differential data signal from the device under test. The receiver circuit also includes a trigger receiver that is responsive to the clock circuit. The trigger receiver is adapted to receive a trigger signal from the device under test. Finally, the receiver circuit includes a control circuit that is coupled to the trigger receiver. The control circuit is adapted to generate a start alignment capture signal based on the received trigger signal to initiate capture of data received at the data receiver for comparison with expected values.

23 Claims, 9 Drawing Sheets

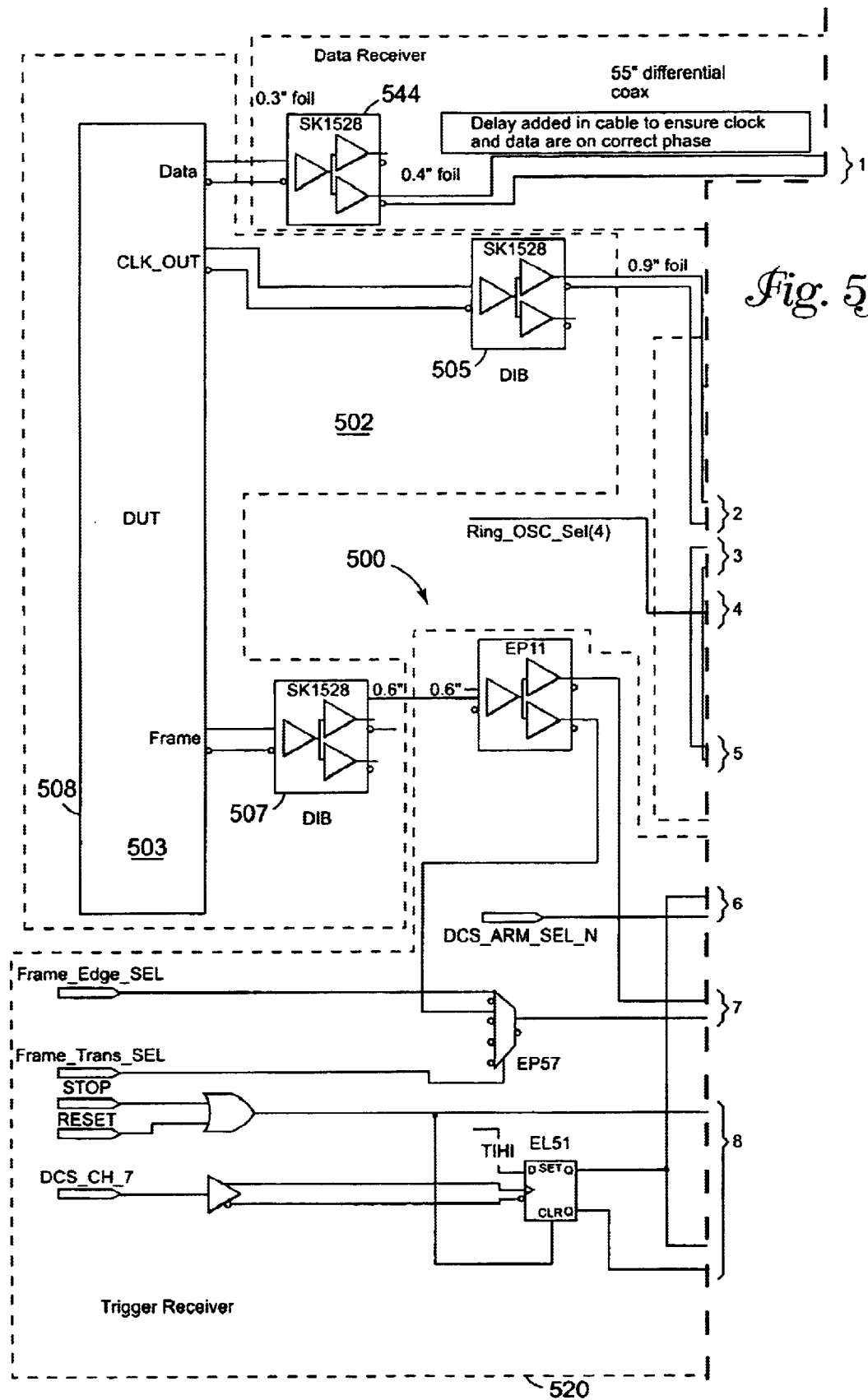
Fig. 5A₁

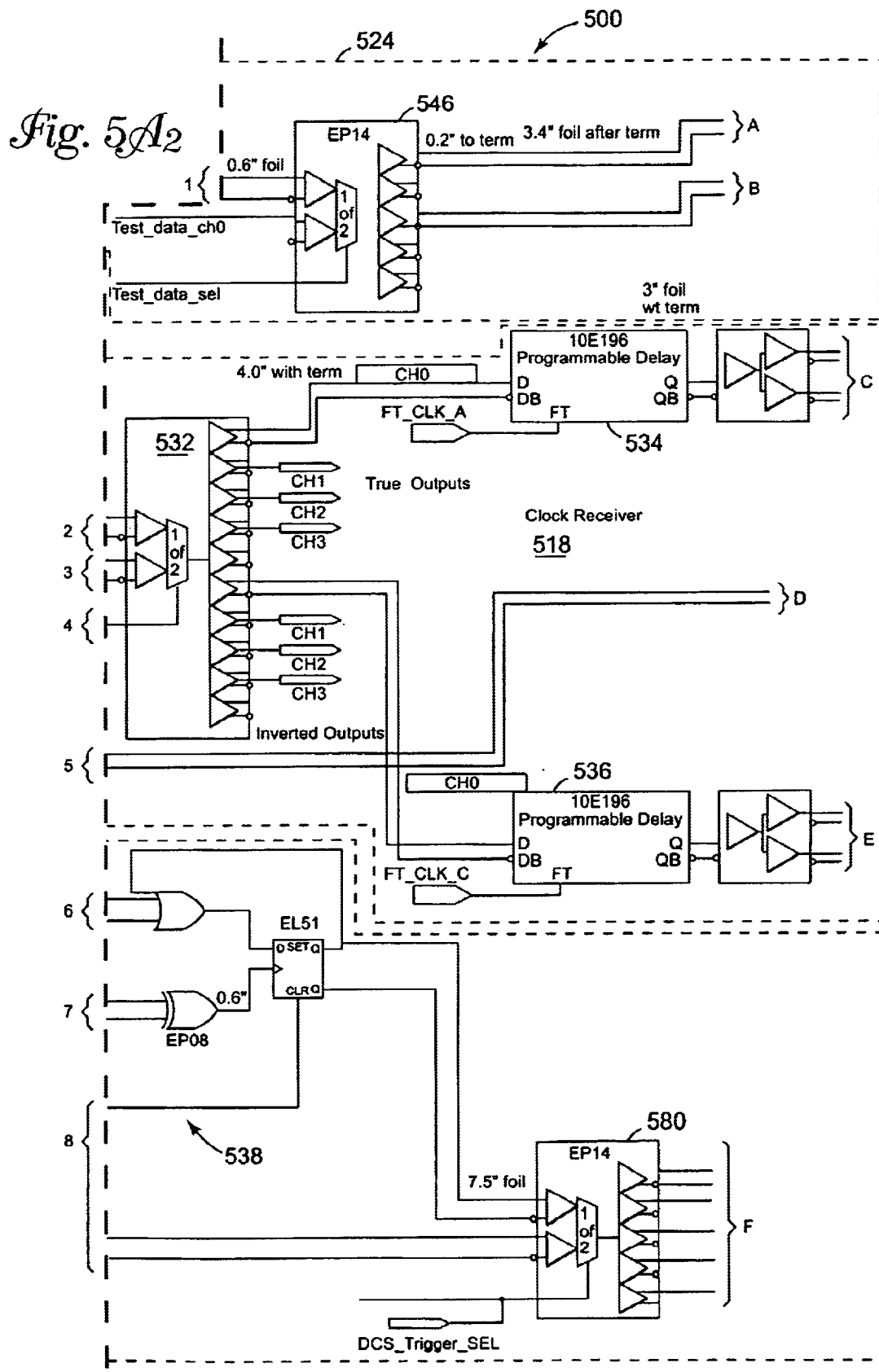
Fig. 5A2

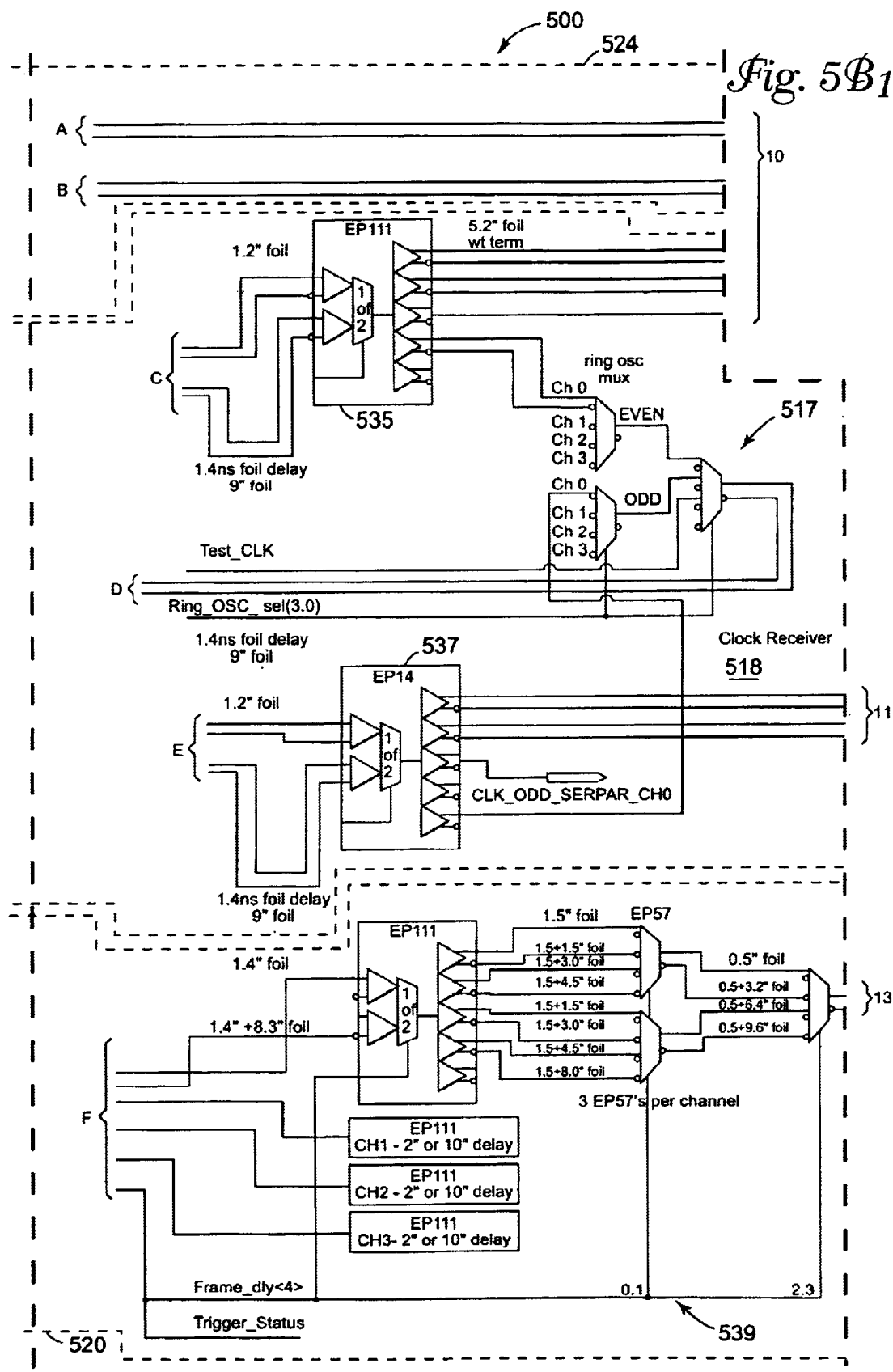
Fig. 5B₁

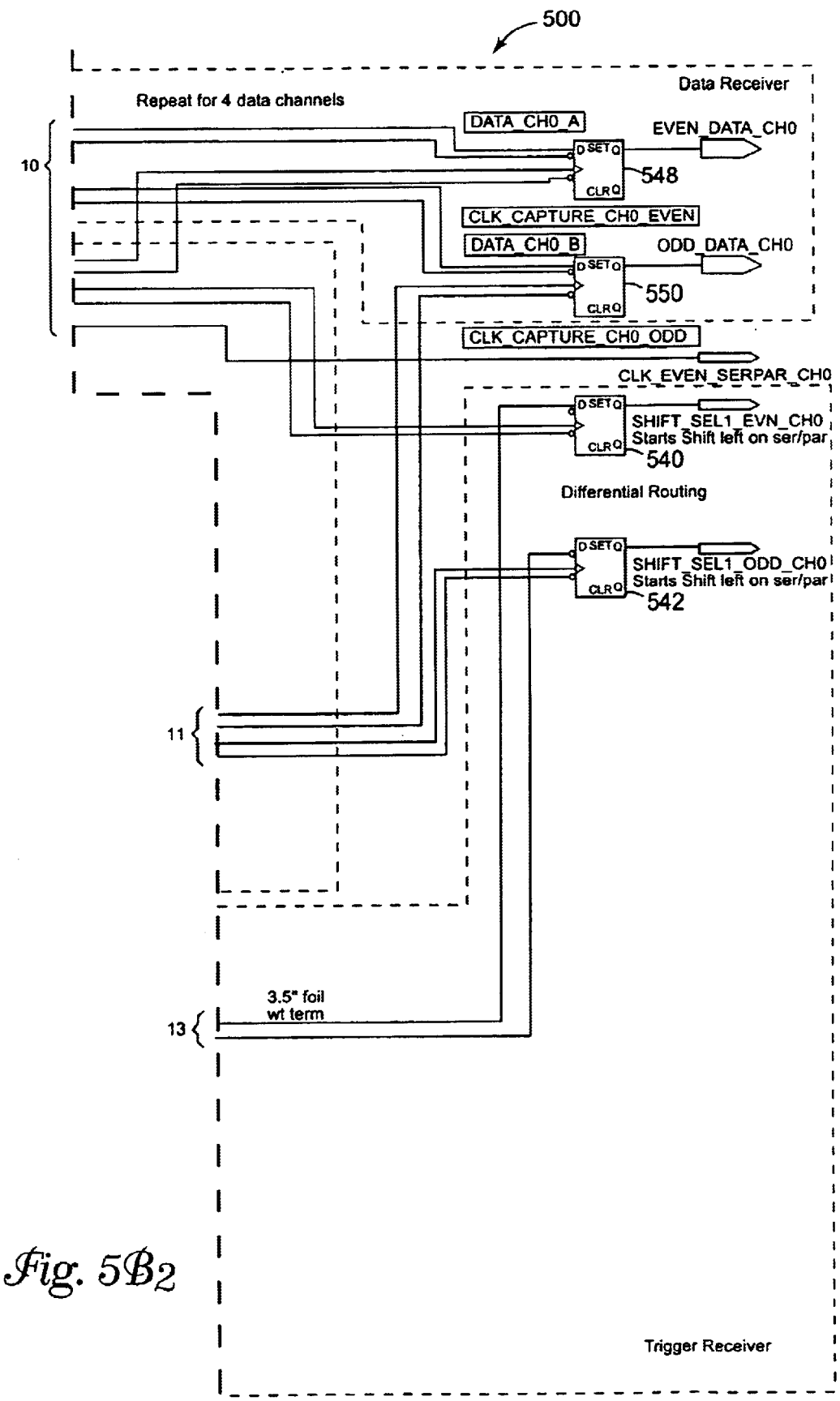
Fig. 5B2

DIFFERENTIAL RECEIVER ARCHITECTURE

TECHNICAL FIELD

The present invention relates generally to the field of electronic test equipment and, in particular, to a differential receiver architecture for automatic test equipment for integrated circuit testing.

BACKGROUND

Integrated circuit chips or semiconductor devices typically undergo testing to verify their operability under a variety of conditions by their manufacturer. Generally, these chips are tested by automatic test equipment called an integrated circuit tester. The integrated circuit tester is colloquially referred to as a "tester." Chips are tested for a variety of reasons. For example, the tester may be used for sorting out faulty chips or for grading the chips on performance characteristics. In addition, a tester may be used during manufacture to guide the repair of chips that are defective. A chip that is being tested is commonly referred to as a device under test (DUT).

Generally testers include a host computer that runs software for controlling various tests on the DUT. Moreover, traditional testers contain numerous "channels" or "pins." Channel circuits typically include a driver circuit to generate test signals and/or a detector circuit or comparator circuit to measure output signals. To test a DUT, selected leads, pins or ports on the DUT are coupled to selected channels of the tester. In a typical testing scenario, one or more of the channels is programmed to simulate an input to the chip. Moreover, a receiver in one or more channels is also programmed to detect one or more expected outputs.

Traditionally, single ended channels were used in the testers because single-ended signals were traditionally used in chips. A single-ended signal comprises a single signal for conveying a digital logic state with reference to a digital ground. A single-ended signal is detected as having a high logic level, a low logic level or a logic state between a high and a low logic level (a "between" state). Problems can arise with single-ended signals during high speed operations due to interference from ground bounce, noise and cross talk.

Some modern chips running at high speeds use differential circuits to generate differential signals to convey logic states. These chips employ differential signal ports. Differential signals convey a digital logic state as differences between two signals, neither one of which is ground. The effects of ground bounce, noise and cross talk are less on high speed systems incorporating differential signals than those systems incorporating single-ended signals. Typically, a differential amplifier is used to compare the differential margin of the signals in determining the logic level. There is a need in the art for a tester that effectively tests a DUT having differential signal ports.

The channel circuitry of testers can also be programmed to generate or check for an expected signal at a precise time. For example, most chips are clocked. That is, most integrated circuits have a clock input that changes states on a periodic basis. Generally, a chip latches a set of input signals at a set time in relation to a change in the clock signal. If valid data signals are not applied to the chip at the change in the clock signal, the chip will latch improper data.

Traditionally, a common clock was used for every chip inside an electronic system. Using a common clock allows each chip to produce its output and latch its input in association with other chips in the electronic system. However, problems can occur with the common clock system when signals move through one part of the electronic system at a different rate than other parts of the electronic system. The differences in time are sometimes called "skew." When designing a system, the skew must be taken into account. Typically, the faster the electronic system, the more difficult it is to design to compensate for the skew.

More recently, a new clocking architecture has been used in systems that need to process many operations per second. This architecture is sometimes referred to as "source synchronous," "clock forwarding" or "echo clocks." In a source synchronous architecture, each chip in an electronic system that produces output signals (data signals) also produces an output clock signal (data clock signal). The data clock signal is fed to other chips in the electronic system along with the data signals. The other chip uses the data clock signal input to latch the input data signals. Because the data clock signal and the data signals travel over similar paths, there is less skew between the data signals and the data clock signal than between the data signals and the common clock. There is a need in the art for a tester that can effectively test DUT's having a source synchronous architecture.

Another problem with testing source synchronous systems relates to the speed of the data processed by the system. Specifically, source synchronous systems operate in a different, independent time domain compared to the tester. As systems increase in speed, it becomes more difficult to align the different time domains of the DUT and the tester. This in turn makes comparison of data read from the DUT with expected data more complicated and prone to error since measurements may be taken at the wrong time due to the dual time domains.

For the reasons state above and for the reasons stated below, which will become apparent to those skilled in the art upon reading and understanding the present specification, there is a need in the art for a tester that can effectively test DUT's having differential signal ports and source synchronous architecture especially in light of the increasing speed of some systems.

SUMMARY

The above-mentioned problems with testers and other problems are addressed by embodiments of the present invention and will be understood by reading and studying the following specification. Embodiments of the present invention capture data from a device under test based on a trigger signal received from the device under test. This trigger signal is a signal that is available during normal operation of the device under test but is used by the tester as a marker or beacon that indicates that it is time to begin capturing data. Thus, the trigger signal provides a link between the timing of the tester and the timing of the device under test. This allows the data captured by the tester to be more accurately compared with expected values for the data.

More particularly, in one embodiment a receiver circuit for a tester for electronic devices is provided. The receiver circuit includes a clock receiver that is adapted to receive a source synchronous clock signal from a device under test. The receiver circuit further includes a data receiver that is responsive to the clock circuit. The data receiver is adapted to receive at least one differential data signal from the device under test. The receiver circuit also includes a trigger receiver that is responsive to the clock circuit. The trigger receiver is adapted to receive a trigger signal from the device under test. Finally, the receiver circuit includes a control circuit that is coupled to the trigger receiver. The control circuit is adapted to generate a start alignment capture signal based on the received trigger signal to initiate capture of data received at the data receiver for comparison with expected values.

BRIEF DESCRIPTION OF THE DRAWINGS

FIGS. 5A and 5B, 5A1, 5A2, 5B1, and 5B2 are a schematic diagram of one embodiment of a receiver for a test system for electronic circuits using source synchronous and differential signals according to the teachings of the present invention.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Embodiments of the present invention provide a mechanism for testing source synchronous electronic devices. In other embodiments, mechanisms are provided for testing devices with differential data signals. Unfortunately, the time reference or timing of the device under test typically differs from the timing of automatic test equipment or testers. This means that the device under test generates signals with respect to a time reference that is not known to the tester. This lack of synchronization between the timing of the device under test and tester could lead to errors in comparing expected output with the data received from the device under test. Advantageously, the embodiments of the present invention described below use a frame or control signal from a device under test as a trigger for capturing data from the device under test. This frame signal acts as a timing beacon that indicates to the tester that data is about to be transmitted to the tester from the device under test. This beacon allows the tester to know when an expected data sequence will begin and thus allows the tester to compare the received data with the expected data with increased accuracy.

I. First Embodiments

Figure 1:
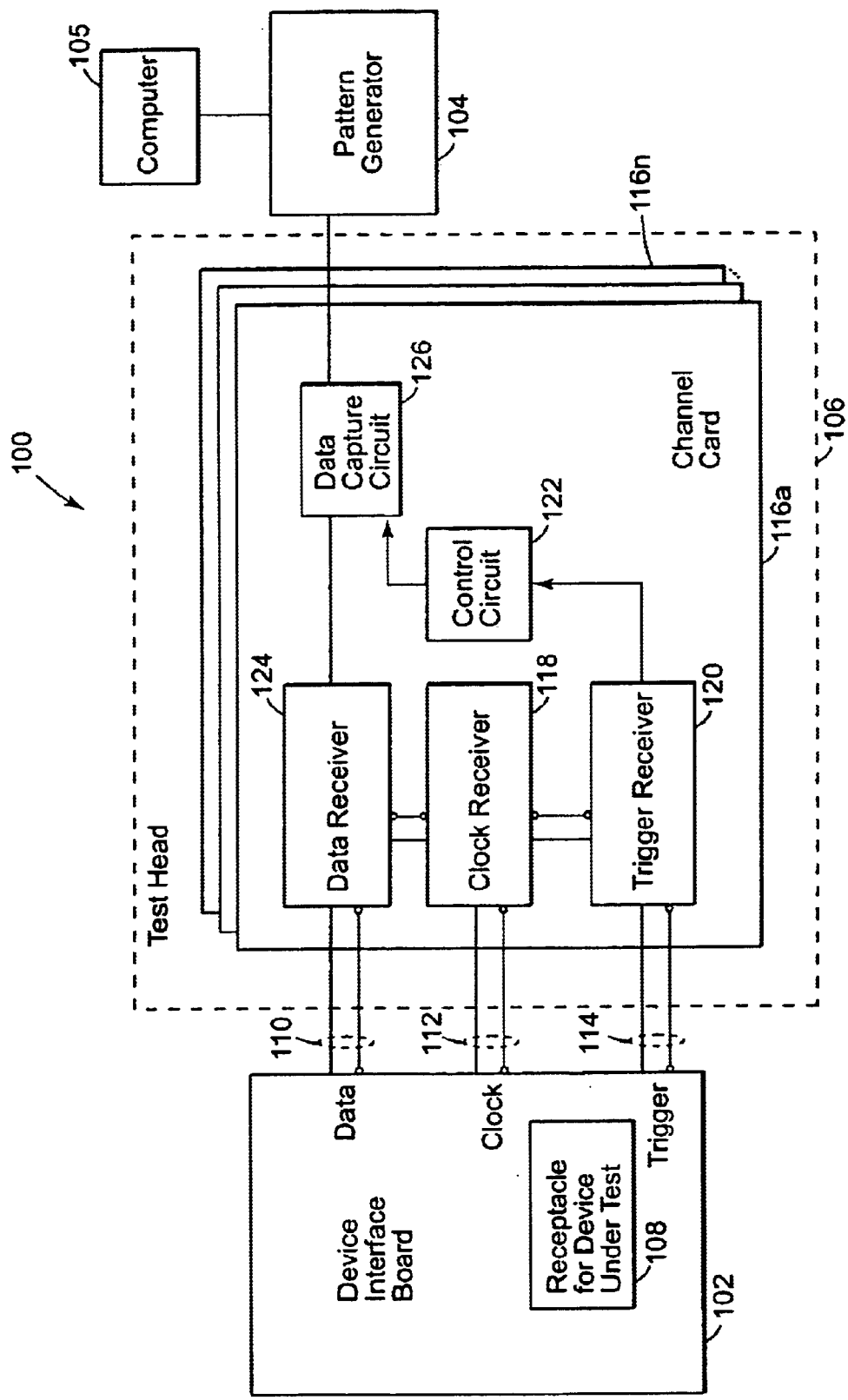
FIG. 1 is a block diagram of one embodiment of a test system according to the teachings of the present invention.

FIG. 1 is a block diagram of one embodiment of a test system, indicated generally at 100, according to the teachings of the present invention. System 100 includes device interface board 102 coupled to computer 105 through test head 106 and pattern generator 104. Device interface board 102 includes receptacle 108 for receiving a device under test. Receptacle 108 comprises, for example, a socket that is adapted to receive the pins of an electronic device or any other appropriate receptacle for an electronic device. Device interface board 102 provides a variety of signals to test head 106. For example, device interface board 102 provides data signals from the device under test to test head 106 over differential data lines 110. Similarly, device interface board 102 further provides clock signals to test head 106 over differential clock lines 112. Finally, device interface board 102 provides a trigger signal, such as a frame or control signal, to test head 106 over differential trigger lines 114. The trigger signal is a signal that is generated during the normal operation of the device under test. System 100 uses this signal to capture the data in a known time frame. This provides the advantage increasing the accuracy in comparing expected data with the captured data to determine if the device under test is operating within normal parameters.

Test head 106 includes a plurality of channel cards 116a, . . . , 116n. Channel cards 116a, . . . , 116n provide a mechanism for providing data to the device under test and reading data from the device under test. It is understood, the test head 106 includes sufficient channel cards to provide the necessary data to the device under test and sufficient channel cards to receive the data from the device under test in order to properly test its operational capacity. Some channel cards only acts as drivers to provide data to the device under test and some channel cards only acts as receivers. However, it is understood, that some channel cards may act as both drivers and receivers.

Channel card 116a in this embodiment includes a differential receiver that receives data from the device under test. For simplicity, only the structure and operation of channel card 116a is described in detail. It is understood, that other channel cards that include a receive function operate in a similar manner to channel card 116a.

Channel card 116a includes clock receiver 118 that is coupled to differential clock lines 112. Clock receiver 118 is further coupled to provide clock signals to trigger receiver 120 and data receiver 124.

Trigger receiver 120 is coupled to trigger lines 114. Trigger receiver 120 receives a trigger signal over trigger lines 114. The trigger signal is provided to control circuit 122. Control circuit 122 uses the trigger signal to initiate the capture of data by channel card 116a. The trigger signal essentially allows channel card 116a to align the data received at data receiver 124 in time with outputs expected to be produced in response to inputs provided to system 100. In one embodiment, trigger receiver 120 captures the trigger signal after the device under test is reset and the tester is armed.

Data receiver 124 is coupled to receive data from the device under test over data lines 110. In one embodiment, data lines 110 include a cable with sufficient delay to allow clock and data signals to be aligned in time. Data receiver 124 is coupled to data capture circuit 126. Data capture circuit 126 is controlled by a control signal from control circuit 122. This control signal is based on the trigger signal received by trigger receiver 120.

In operation, system 100 tests the operation of an electronic device in receptacle 108 of device interface board 102 using trigger signals generated by the device under test to initiate the capture of data by system 100. Computer 105 provides input signals to the device under test in receptacle 108 of device interface board 102 through selected channel cards 116a, . . . , 116n. The device under test further produces signals that are monitored by system 100.

Channel card 116a receives selected signals from the device under test. First, channel card 116a receives clock signals from the device under test with clock receiver 118. Clock receiver 118 provides these clock signals to data receiver 124 and trigger receiver 120 to control the receipt of both data and trigger signals from the device under test.

When a trigger signal is received, channel card 116a captures the trigger signal and provides it to control circuit 122. Control circuit 122 generates a control signal that initiates the capture of data by data capture circuit 126. After initiation, data capture circuit 126 captures the stream of data received by data receiver 124. The captured data is provided to pattern generator 104 for analysis and processing, e.g., the captured data is compared to expected data.

II. Second Embodiment

Figure 2:
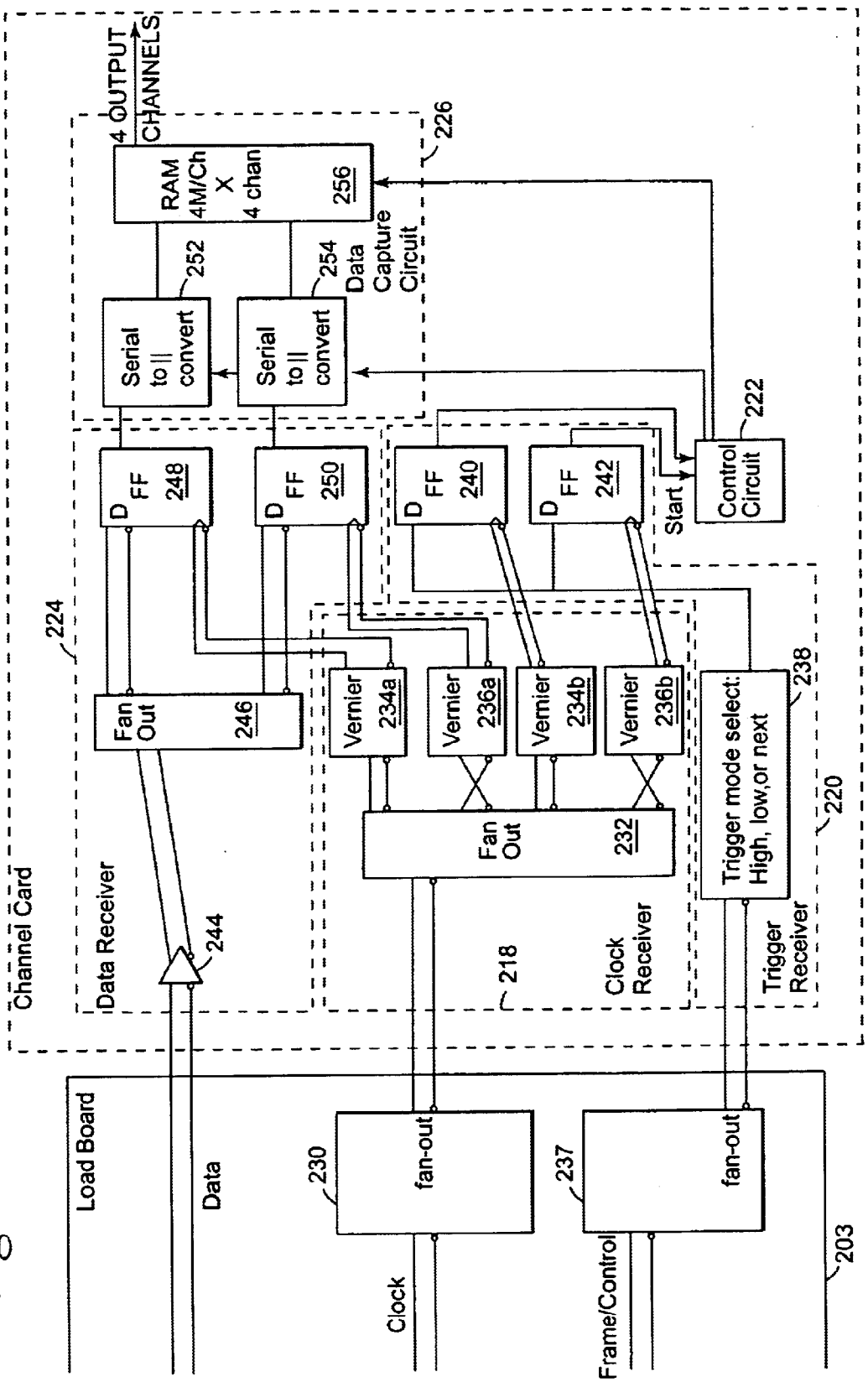
FIG. 2 is a block diagram of one embodiment of a channel card with a receiver for a test system for electronic circuits using source synchronous and differential signals according to the teachings of the present invention.

FIG. 2 is a block diagram of one embodiment of a channel card, indicated generally at 200, that implements a receiver for a test system for electronic circuits using source synchronous and differential signals according to the teachings of the present invention. Channel card 200 uses a trigger signal from a device under test to initiate capturing data from the device under test so as to allow proper comparison with expected values. Channel card 200 includes clock receiver 218, trigger receiver 220, control circuit 222, data receiver 224, and data capture circuit 226. These components combine to implement the receiver function of channel card 200 and are described in more detail below.

A. Clock Signals

Clock receiver 218 receives a differential clock pair or clock signal from a source synchronous device under test. In this embodiment, clock receiver 218 receives the clock signal from fan out circuit 230 on load board 203. Clock receiver 218 includes fan out circuit 232 that is coupled to the differential clock pair or signal from fan out 230. Fan out circuit 232 is selectively coupled to vernier circuits 234a, 234b, 236a, and 236b.

Fan out 232 and vernier circuits 234a, 234b, 236a, and 236b generate the timing signals for data receiver 224 and trigger receiver 220. In this embodiment, the timing signals include two clock signals provided to data receiver 224 and two clock signals provided to trigger receiver 220. Vernier circuits 234a and 234b provide timing signals to data receiver 224 and trigger receiver 220, respectively. These timing signals trigger on a leading edge of the clock signal received at fan out 232. Similarly, vernier circuits 236a and 236b receive cross coupled differential inputs from fan out 232 to provide timing signals to data receiver 220 and trigger receiver 224, respectively, that trigger on a trailing edge of the clock signal received at fan out 232. Vernier circuits 234a, 234b, 236a, and 236b also allow adjustment of the timing of the clock signal with respect to the data to provide proper alignment in the test system.

It is noted that the fan out 230 of load board 203, in one embodiment, provides the same clock signal to another channel card.

B. Trigger Signal

Trigger receiver 220 receives a trigger signal from fan out 237 of load board 203. It is noted that fan out 237 may also provide, in one embodiment, the same trigger signal to up to 8 channel cards.

Trigger receiver 220 includes logic circuit 238 that is coupled to receive the trigger signal from fan out 237. Logic circuit 238 sets the edge of the trigger signal that triggers action in channel card 200. For example, in one embodiment, logic circuit 238 determines whether the trigger signal triggers or a leading edge, a trailing edge, or on the next edge in the trigger signal. Logic circuit 238 further includes a timing element that allows trigger receiver 220 to be aligned with clock receiver 218 and data receiver 224.

When the selected edge is detected, logic circuit 238 passes the next trigger signal to flip-flops 240 and 242. Flip-flop 240 is clocked by the output of vernier 234b and flip-flop 242 is clocked by the output of vernier 236b. Flip-flop 240a latches the trigger signal on a leading edge of the clock signal from the device under test and flip-flop 242 latches the trigger signal on the trailing edge of the clock signal from the device under test. The output of flip-flops 240 and 242 are provided to control circuit 222.

C. Data

Data receiver 224 receives differential data from load board 203 with differential receiver 244. In one embodiment, data receiver 224 receives up to four channels of data from load board 203.

In one embodiment, data receiver 224 captures data both on a leading edge and a trailing edge of clock signals from the device under test. This is referred to as a "double data rate" (DDR) system. Differential receiver 244 is coupled to fan out 246 over a cable with a delay selected to synchronize the phase in channel card 200 of the data and clock signals from the device under test. Fan out 246 is further coupled to provide data signals to flip-flops 248 and 250. Flip-flop 248 is clocked by a signal from vernier 234a to latch data from fan out 246 on a leading edge of the clock signal received at clock receiver 218. Similarly, flip-flop 250 is clocked by a signal from vernier 236a to latch data from fan out 246 on a trailing edge of the clock signal received at clock receiver 218. Flip-flops 248 and 250 each provide data to data capture circuit 226.

Data capture circuit 226 captures data from data receiver 224 based on a trigger signal from control circuit 222. Data capture circuit 226 includes serial to parallel converters 252 and 254. Data capture circuit 226 further includes memory 256. Serial to parallel converters 252 and 254 are coupled to receive a control signal from control circuit 222. This control signal indicates when data capture circuit 226 is to begin capturing data from data receiver 224 and is based on receipt of the trigger signal by trigger receiver 220.

D. Operation

In operation, the channel card 200 captures data from a device under test based on a received trigger signal such that the captured data is more accurately compared with expected data. The trigger signal provides channel card 200 with a reference point for capturing data that overcomes differences in time reference between the device under test and channel card 200. Clock receiver 218 receives a source synchronous clock signal from the device under test and produces leading edge and trailing edge clock signals for the data receiver 224 and trigger receiver 220. Based on the clock signals, trigger receiver 220 monitors the output of the device under test for the known trigger, e.g., a frame or control signal that indicates specific data that will be appearing on the data line. This trigger signal is latched in flip-flops 240 and 242 and provided to control circuit 222. The data receiver 224 receives differential data from the device under test and latches the data off both the leading and trailing edges of the clock signal received by clock receiver 218.

When the trigger signal is received by trigger receiver 220, control circuit 222 generates a control signal that initiates the operation of serial to parallel converters 252 and 254. Serial to parallel converters 252 and 254 convert the serial data received from flip-flop 248 and 250 into parallel bit streams. This parallel data is stored in memory 256 for comparison with expected data.

Figure 3:
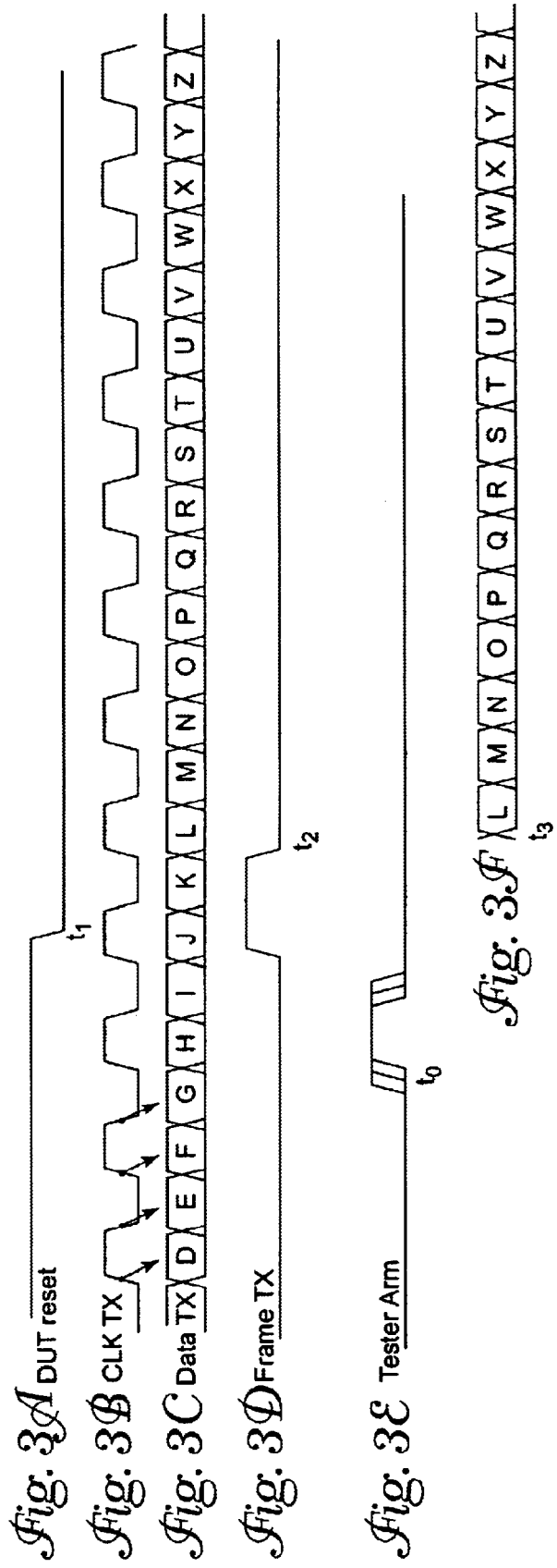
FIGS. 3A–3F are graphs that illustrate timing of signals for a receiver according to an embodiment of the present invention.

FIGS. 3A–3F are graphs that illustrate timing of signals for one embodiment of the operation of channel card 200 of FIG. 2 according to the teachings of the present invention. At time $t_0$, the tester is armed as indicated in FIG. 3E. At time $t_1$, the device under test (DUT) goes out of the reset state as indicated in FIG. 3A. At this point, the channel card will begin to capture data once the trigger signal is received.

As shown in FIG. 3D, a frame signal is received at time $t_2$ (trailing edge). This is received by trigger receiver 220 and provided to control circuit 222. Control circuit 222 generates control signals for data capture circuit 226 that cause data capture circuit 226 to begin capturing data. As indicated in FIG. 3F, data capture circuit 226 captures data beginning at time $t_3$. Thus, data received prior to time $t_3$ (e.g., data D, E, F, G, H, I, J, and K from FIG. 3C) is not captured, but data beginning with time $t_3$ (data L, M, N . . . ) is captured. Since the frame signal is a functional signal of the device under test with a known relationship to the data to be produced by the device under test, the frame signal provides a point of reference in time for comparing the captured data with expected data. Thus, the device under test can be properly evaluated.

III. Third Embodiment

Figure 4:
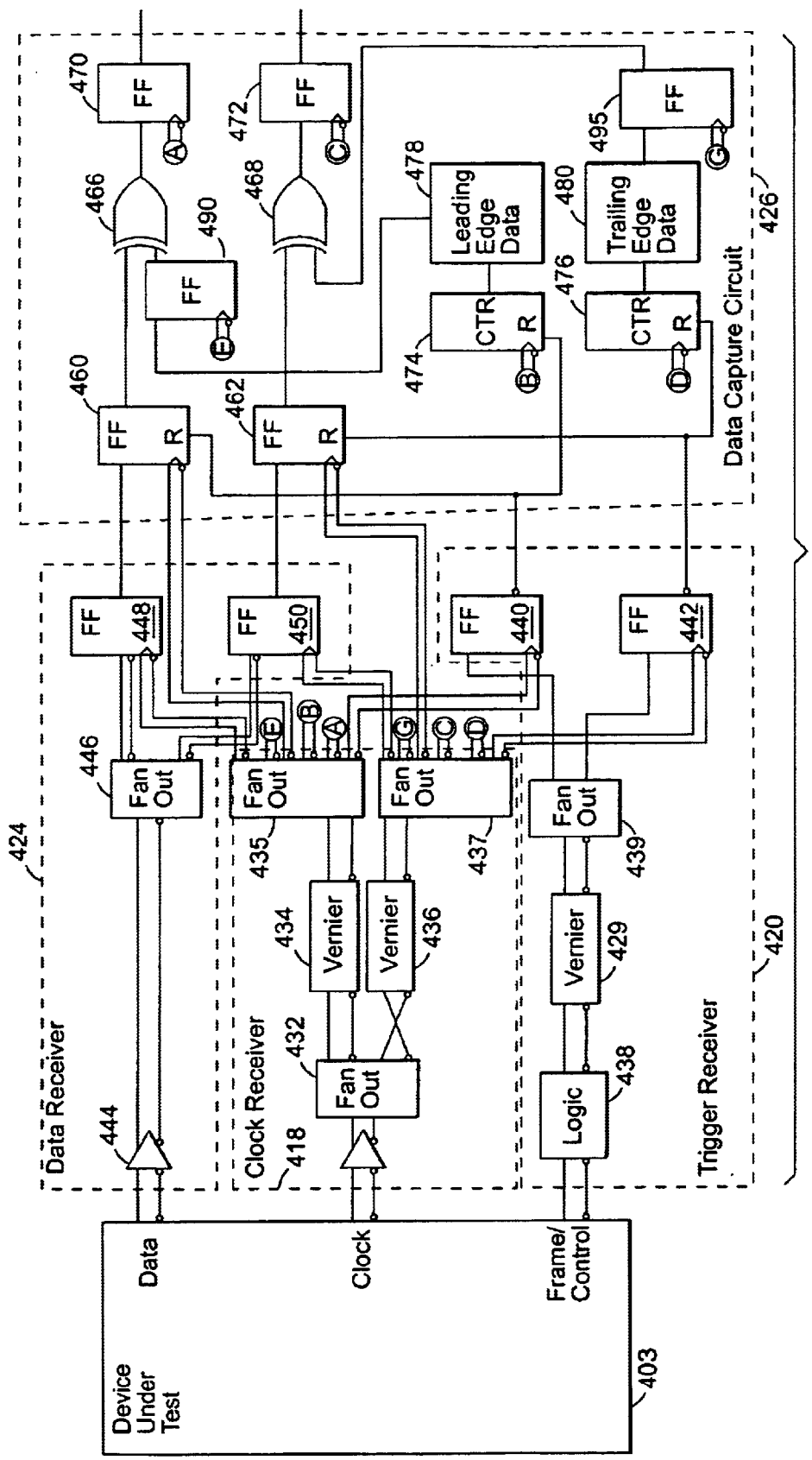
FIG. 4 is a block diagram of another embodiment of a receiver for a test system for electronic circuits using source synchronous and differential signals according to the teachings of the present invention.

FIG. 4 is a block diagram of one embodiment of a channel card, indicated generally at 400, that implements a receiver for a test system for electronic circuits using source synchronous and differential signals according to the teachings of the present invention. Channel card 400 uses a trigger signal from device under test 403 to initiate capturing data from device under test 403 so as to allow proper comparison with expected values. Channel card 400 includes clock receiver 418, trigger receiver 420, control circuit 422, data receiver 424, and data capture circuit 426. These components are used in combination to implement the receiver function and are described in detail below.

A. Clock Receiver

Clock receiver 418 receives a differential clock pair or clock signal from a source synchronous device under test. Clock receiver 418 includes fan out circuit 432 that is coupled to the differential clock pair or clock signal from the device under test. Fan out circuit 432 is selectively coupled to vernier circuits 434 and 436. Vernier circuit 436 is cross coupled with the output of fan out 432 so as to invert the pulses of the clock signal and allow triggering on the trailing edge of the clock signal. Vernier circuit 434 is coupled to allow triggering on the leading edges of pulses from the clock signal.

Clock receiver 418 further includes fan outs 435 and 437. Fan out 435 is coupled to the output of vernier circuit 434 and fan out 437 is coupled to the output of vernier circuit 436.

Fan out 432, 435 and 437 and vernier circuits 434 and 436 generate the timing signals for data receiver 424 and trigger receiver 420. In this embodiment, the timing signals include two clock signals provided to data receiver 424 and two clock signals provided to trigger receiver 420. Fan out 435 provides timing signals to data receiver 424 and trigger receiver 420. These timing signals trigger operation based on a leading edge of the clock signal from the device under test. Similarly, fan out 437 provides timing signals to data receiver 420 and trigger receiver 424 that trigger operation based on a trailing edge of the clock signal from the device under test. Vernier circuits 434 and 436 also allow adjustment of the timing of the clock signal with respect to the data to provide proper alignment in the test system.

B. Trigger Receiver

Trigger receiver 420 receives a trigger signal from device under test 403. Trigger receiver 420 includes logic circuit 438 that is coupled to receive the trigger signal from device under test 403. Logic circuit 438 sets the edge of the trigger signal that triggers action in channel card 400. For example, in one embodiment, logic circuit 438 determines whether the trigger signal triggers on a leading edge, a trailing edge, or on the next edge in the trigger signal.

When the selected edge is detected, logic circuit 438 passes the next trigger signal to flip-flops 440 and 442 via vernier 429 and fan out 439. Vernier 429 is included to match up the timing of trigger receiver 420 with clock receiver 418 and data receiver 424. Flip-flop 440 is clocked by a signal from fan out 435 and flip-flop 442 is clocked by a signal from fan out 437. Flip-flop 440 latches the trigger signal on a leading edge of the clock signal from the device under test 403 and flip-flop 442 latches the trigger signal on the trailing edge of the clock signal from the device under test 403. The outputs of flip-flops 440 and 442 are provided to data capture circuit 426.

C. Data Receiver

Data receiver 424 receives differential data from device under test 403 with differential receiver 444. In one embodiment, data receiver 424 receives up to four channels of data from load board 403.

In one embodiment, data receiver 424 captures data both on a leading edge and a trailing edge of clock signals from the device under test 403. Differential receiver 444 is coupled to fan out 446 over a cable with a delay selected to synchronize the phase in channel card 400 of the data and clock signals from device under test 403. Fan out 446 is further coupled to provide data signals to flip-flops 448 and 450. Flip-flop 448 is clocked by a signal from fan out 435 to latch data from fan out 446 on a leading edge of the clock signal received at clock receiver 418. Similarly, flip-flop 450 is clocked by a signal from fan out 437 to latch data from fan out 446 on a trailing edge of the clock signal received at clock receiver 418. Flip-flops 448 and 450 each provide data to data capture circuit 426.

D. Data Capture Circuit

Data capture circuit 426 captures data from data receiver 424 based on a trigger signal from trigger receiver 420. Data capture circuit 426 further compares the captured data with expected data and produces output signals that indicate when the captured data departs from the expected data.

Data capture circuit 426 includes flip-flops 460 and 462. Flip-flop 460 captures data on the leading edge of pulses in the clock signal from the device under test 403. Similarly, flip-flop 462 captures data on the trailing edge of clock signals from device under test 403. Flip-flop 460 is coupled to flip-flop 448 and flip-flop 462 is coupled to flip-flop 450. Flip-flop 460 is clocked by an output of fan out 435 and flip-flop 462 is clocked by an output of fan out 437.

Flip-flops 440 and 442 of trigger receiver 420 control the capture of data by flip-flops 460 and 462. Specifically, an inverted output of flip-flop 440 is provided to the reset input of flip-flop 460. Thus when flip-flop 440 captures the trigger signal on a trailing edge of the clock signal from device under test 403, flip-flop 460 is taken out of reset and allowed to capture data from flip-flop 448 of the next clock pulse. Similarly, flip-flop 442 includes an inverted output that is coupled to the reset of flip-flop 462. When flip-flop 442 captures the trigger signal on the trailing edge of the clock signal from device under test 403, flip-flop 462 is taken out of reset and allowed to capture the data from flip-flop 450. Thus, once the trigger signal is received, flip-flops 460 and 462 are taken out of reset and allowed to pass data onto additional circuitry for comparison with expected values.

Flip-flop 460 is coupled to an input of XOR gate 466 to allow comparison with expected data for the data received on the leading edge of the clock signal from the device under test. Specifically, counter 474 is clocked by leading edge pulses from fan out 435. Counter 474 is further taken out of reset by flip-flop 440 when a trigger signal is latched. Counter 474 is coupled to leading edge data 478 to provide the expected leading edge data to an input of XOR gate 466 through flip-flop 490. With this data, XOR gate 466 compares the data received on the leading edge of the clock signal from the device under test with the expected leading edge data. If the received data matches the expected data, XOR gate 466 produces a low logic level output. If there is a mismatch, then XOR gate 466 produces a high logic level. The output of this comparison by XOR gate 466 is provided to flip-flop 470. Flip-flop 470 is clocked by the output of fan out 435. The output of flip-flop 470 provides a measure of the accuracy of the operation of the device under test.

For the trailing edge data, XOR gate 468 makes a similar comparison. XOR gate 468 has a first input coupled to the output of flip-flop 462. Counter 476 is clocked by trailing edge pulses from fan out 437. Counter 476 is further taken out of reset by flip-flop 442 when a trigger signal is latched. Counter 476 is coupled to trailing edge data 480 to provide the expected trailing edge data to a second input of XOR gate 468 through flip-flop 495. With this data XOR gate 468 compares the data received on the trailing edge of the clock signal from the device under test 403 with the expected trailing edge data. If the received data matches the expected data, XOR gate 468 produces a low logic level output. If there is a mismatch, then XOR gate 468 produces a high logic level. The output of this comparison by XOR gate 468 is provided to flip-flop 472. Flip-flop 472 is clocked by the output of fan out 437. The output of flip-flop 472 provides a measure of the accuracy of the operation of the device under test 403.

IV. Fourth Embodiment

Figure 5:
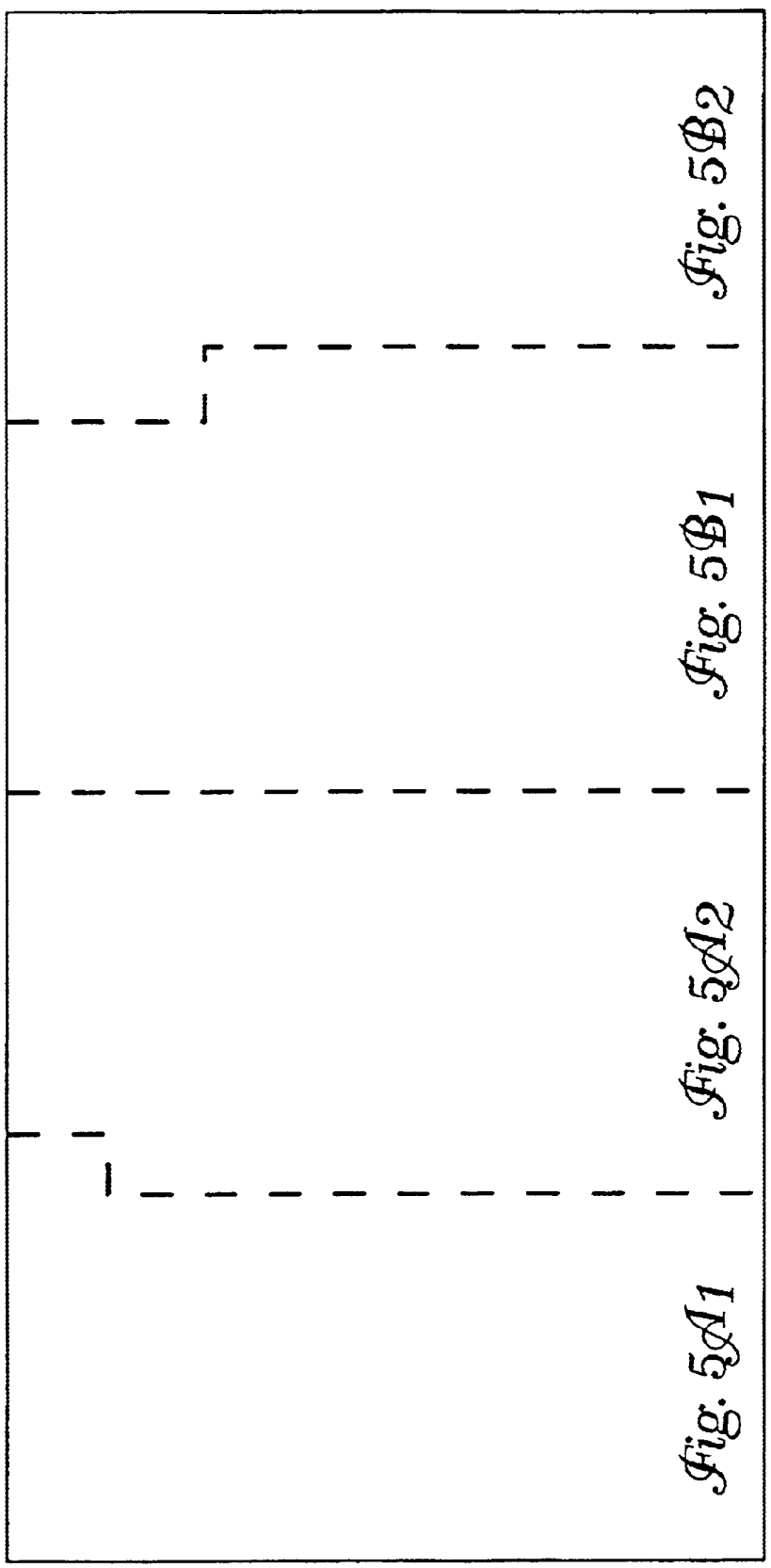

FIGS. 5A and 5B are a schematic diagram of one embodiment of a receiver, indicated generally at 500 for a test system for electronic circuits using source synchronous and differential signals according to the teachings of the present invention. Channel card 500 uses a trigger signal from device under test 503 in receptacle 508 of device interface board 502 to initiate capturing data from device under test 503 so as to allow proper comparison with expected values. Channel card 500 includes clock receiver 518, trigger receiver 520, control circuit 522, data receiver 524, and data capture circuit 526. Each of these components is discussed in turn below.

A. Clock Receiver

Clock receiver 518 receives a differential clock pair or clock signal from a source synchronous device under test 503. The clock signal is received from fan out 505. Fan out 505 also provides the same clock signal to other channel cards.

Clock receiver 518 includes fan out circuit 532 that is coupled to the differential clock pair or clock signal from the device under test. Fan out circuit 532 provides clock signals for up to four data channels. However, for clarity in the drawings, circuitry for only one channel, "CH0" is shown and described.

Fan out circuit 532 is selectively coupled to vernier circuits or programmable delay elements 534 and 536. Vernier circuit 536 is cross coupled with the output of fan out 532 so as to invert the pulses of the clock signal and allow triggering on the trailing edge of the clock signal. Vernier circuit 434 is coupled to allow triggering on the leading edges of pulses from the clock signal.

Clock receiver 518 further includes fan outs 535 and 537. Fan out 535 is coupled to the output to receive the output of vernier circuit 534 and fan out 537 is coupled to receive the output of vernier circuit 536.

Fan out 532, 535 and 537 and vernier circuits 534 and 536 generate the timing signals for data receiver 524 and trigger receiver 520. In this embodiment, the timing signals include two clock signals provided to data receiver 524 and two clock signals provided to trigger receiver 520. Fan out 535 provides timing signals to data receiver 524 and trigger receiver 520 that trigger operation based on a leading edge of the clock signal received at fan out 532. Similarly, fan out 532 provides timing signals to data receiver 520 and trigger receiver 524 that trigger operation based on a trailing edge of the clock signal received at fan out 532.

In one embodiment, clock receiver 518 also includes a ring oscillator 517 that is selectively used to calibrate vernier circuits 534 and 536.

B. Trigger Receiver

Trigger receiver 520 receives a trigger signal from device under test 503 through fan out 507 on device interface board 502. Fan out 507 provides the same trigger signal to other channel cards. Trigger receiver 520 includes logic circuit 538 that is coupled to receive the trigger signal from device under test 403. Logic circuit 538 sets the edge of the trigger signal that triggers action in channel card 500. For example, in one embodiment, logic circuit 538 determines whether the trigger signal triggers on a leading edge, a trailing edge, or on the next edge in the trigger signal based on control signals FRAME_EDGE_SEL and FRAME_TRANS_SEL. In one embodiment, fanout 580 includes a multiplexer that selectively disables trigger receiver 520 from triggering on the frame or control signal from DUT 503 using control signal DCS_TRIGGER_SEL. A more conventional trigger is used in place of the frame or control signal when this option is selected.

When the selected edge is detected, logic circuit 538 passes the next trigger signal to flip-flops 540 and 542 through fan out 539. In one embodiment, fan out 539 includes a selectable delay. This selectable delay is provided to align trigger receiver with clock receiver 518 and data receiver 524. Flip-flop 540 is clocked by a signal from fan out 535 and flip-flop 542 is clocked by a signal from fan out 537. Flip-flop 540 latches the trigger signal on a leading edge of the clock signal from device under test 503 and flip-flop 542 latches the trigger signal on the trailing edge of the clock signal from device under test 503. The output of flip-flops 540 and 542 provide a basis for controlling the start alignment capture of data from the device under test.

C. Data Receiver

Data receiver 524 receives differential data from device under test 503 with differential receiver 544. In one embodiment, data receiver 524 receives up to four channels of data from load board 503.

In one embodiment, data receiver 524 captures data both on a leading edge and a trailing edge of clock signals from the device under test 503. Differential receiver 544 is coupled to fan out 546 over a cable with a delay to compensate for the minimum delay through the clock path. Fan out 546 is further coupled to provide data signals to flip-flops 548 and 550. Flip-flop 548 is clocked by a signal from fan out 535 to latch data from fan out 546 on a leading edge of the clock signal received at clock receiver 518. Similarly, flip-flop 550 is clocked by fan out 537 to latch data from fan out 546 on a trailing edge of the clock signal received at clock receiver 518. Flip-flops 548 and 550 each provide data that is to be captured based on signals from flip-flops 540 and 542.

Although specific embodiments have been illustrated and described in this specification, it will be appreciated by those of ordinary skill in the art that any arrangement that is calculated to achieve the same purpose may be substituted for the specific embodiment shown. This application is intended to cover any adaptations or variations of the present invention. For example, other signals from the device under test can be used to trigger the capture of data. Further, embodiments of the present invention are not limited to capturing data in a double data rate format. Further, any acceptable mechanism can be used to compare the captured data with the expected data.

What is claimed is:

1. A channel card for a tester for electronic devices, the channel card comprising:
   a clock receiver that is adapted to receive a source synchronous clock signal from a device under test;
   a data receiver, responsive to the clock circuit, the data receiver adapted to receive at least one differential data signal from the device under test;
   a trigger receiver, responsive to the clock circuit, the trigger receiver adapted to receive a trigger signal from the device under test;
   a control circuit, coupled to the trigger receiver, the control circuit adapted to generate a start alignment capture signal based on the received trigger signal; and
   a data capture circuit, responsive to the data receiver and the control circuit, the data capture circuit adapted to initiate capturing of data from the data receiver based on the capture signal.

2. The channel card of claim 1, wherein the data capture circuit comprises:
   at least one serial to parallel converter, responsive to the data receiver; and
   a memory circuit, responsive to the at least one serial to parallel converter, wherein the serial to parallel converter begins providing parallel data to the memory circuit based on the capture signal.

3. The channel card of claim 1, wherein the data capture circuit comprises a comparison circuit that compares the captured data with expected values.

4. The channel card of claim 1, wherein the clock receiver comprises first and second verniers that selectively adjust the leading edge and trailing edge of the clock signal.

5. The channel card of claim 1, wherein the data receiver comprises a data receiver that receives data on both a leading edge and a trailing edge of a clock pulse.

6. The channel card of claim 1, wherein the data receiver comprises:
   a differential receiver adapted to receive a differential data signal from the device under test;
   a fan out circuit, responsive to the differential receiver; and
   first and second flip-flops, responsive to the fan out circuit and the clock receiver, wherein the first flip-flop captures data on a leading edge of the clock signal and the second flip-flop captures data on a trailing edge of the clock signal.

7. The channel card of claim 1, wherein the trigger receiver comprises a logic circuit that selects one of a plurality of trigger modes.

8. The channel card of claim 1, wherein the trigger receiver comprises a logic circuit that selects among leading edge, trailing edge, or next edge as a trigger signal.

9. A method for testing an electric device having differential signal outputs, the method comprising:
   receiving a differential clock pair from a device under test;
   receiving a differential data signal from at least one of the differential signal outputs of the device under test;
   receiving a differential trigger signal from the device under test;
   latching the trigger signal based on the differential clock pair;
   when the trigger signal is received, initiating the capture of the differential data the based on the trigger signal and the differential clock pair.

10. The method of claim 9, wherein receiving a trigger signal comprises receiving one of a control or a frame signal.

11. The method of claim 9, wherein receiving a differential data signal comprises receiving a double data rate (DDR) differential data signal.

12. The method of claim 9, wherein initiating capture of the differential data comprises initiating the operation of at least one serial to parallel converter for storing the data in a memory.

13. The method of claim 9, wherein initiating capture of the differential data comprises latching the data using the differential clock pair and the trigger signal and comparing the latched data with expected values.

14. The method of claim 9, and further comprising generating at least one control signal based on the at least one trigger signal.

15. A tester for electronic devices, the tester comprising:
   a device interface board having a receptacle that is adapted to receive a device under test;
   a computer that is programmed to provide test data to the device under test and to process signals received from the device under test;
   a test head, coupled between the device interface board and the computer, the test head including at least one channel card; and
   the at least one channel card including:
      a clock receiver that is adapted to receive a source synchronous clock signal from the device under test,
      a data receiver, responsive to the clock circuit, the data receiver adapted to receive at least one differential data signal from the device under test;
      a trigger receiver, responsive to the clock circuit, the trigger receiver adapted to receive a trigger signal from the device under test;
      a control circuit, coupled to the trigger receiver, the control circuit adapted to generate a capture signal based on the received trigger signal; and
      a data capture circuit, responsive to the data receiver and the control circuit, the data capture circuit adapted to initiate capturing of data from the data receiver based on the capture signal.

16. The tester of claim 15, wherein the data capture circuit comprises:
   at least one serial to parallel converter, responsive to the data receiver; and
   a memory circuit, responsive to the at least one serial to parallel converter, wherein the serial to parallel converter begins providing parallel data to the memory circuit based on the capture signal.

17. The tester of claim 15, wherein the data capture circuit comprises a comparison circuit that compares the captured data with expected values.

18. The tester of claim 15, wherein the clock receiver comprises first and second verniers that selectively adjust the leading edge and trailing edge of the clock signal.

19. The tester of claim 15, wherein the data receiver comprises a data receiver that receives data on both a leading edge and a trailing edge of a clock pulse.

20. The tester of claim 15, wherein the data receiver comprises:
   a differential receiver adapted to receive a differential data signal from the device under test;
   a fan out circuit, responsive to the differential receiver; and
   first and second flip-flops, responsive to the fan out circuit and the clock receiver, wherein the first flip-flop captures data on a leading edge of the clock signal and the second flip-flop captures data on a trailing edge of the clock signal.

21. The tester of claim 15, wherein the trigger receiver comprises a logic circuit that selects one of a plurality of trigger modes.

22. The tester of claim 15, wherein the trigger receiver comprises a logic circuit that selects among leading edge, trailing edge, or next edge as a trigger signal.

23. A receiver circuit for a tester for electronic devices, the receiver circuit comprising:
   a clock receiver that is adapted to receive a source synchronous clock signal from a device under test;
   a data receiver, responsive to the clock circuit, the data receiver adapted to receive at least one differential data signal from the device under test;
   a trigger receiver, responsive to the clock circuit, the trigger receiver adapted to receive a trigger signal from the device under test; and
   a control circuit, coupled to the trigger receiver, the control circuit adapted to generate a capture signal based on the received trigger signal to initiate capture of data received at the data receiver for comparison with expected values.

* * * * *